United States Patent
Lee et al.

(10) Patent No.: US 8,391,095 B2
(45) Date of Patent: Mar. 5, 2013

(54) METHOD CONTROLLING DEEP POWER DOWN MODE IN MULTI-PORT SEMICONDUCTOR MEMORY

(75) Inventors: Ho-Cheol Lee, Yongin-si (KR); Jung-Bae Lee, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 228 days.

(21) Appl. No.: 12/768,060

(22) Filed: Apr. 27, 2010

(65) Prior Publication Data

US 2010/0309742 A1 Dec. 9, 2010

(30) Foreign Application Priority Data

Jun. 3, 2009 (KR) .................. 10-2009-0049067

(51) Int. Cl.
*G11C 5/14* (2006.01)

(52) U.S. Cl. .................................. 365/226; 365/230.06

(58) Field of Classification Search .................. 365/226, 365/230.06
See application file for complete search history.

(56) References Cited

U.S. PATENT DOCUMENTS

| | | | |
|---|---|---|---|
| 2004/0184336 A1* | 9/2004 | Shore et al. | 365/222 |
| 2007/0008789 A1* | 1/2007 | Kwak | 365/189.05 |
| 2008/0077813 A1* | 3/2008 | Keller et al. | 713/320 |
| 2008/0235528 A1 | 9/2008 | Kim et al. | |
| 2009/0102510 A1* | 4/2009 | Park | 326/30 |

FOREIGN PATENT DOCUMENTS

| | | |
|---|---|---|
| JP | 2003067241 A | 3/2003 |
| KR | 1020050075188 A | 7/2005 |

* cited by examiner

*Primary Examiner* — Michael Tran
(74) *Attorney, Agent, or Firm* — Volentine & Whitt, PLLC (57) ABSTRACT

Disclosed is a method of controlling a deep power down mode in a multi-port semiconductor memory having a plurality of ports connected to a plurality of processors. Control of the deep power down mode in the multi-port semiconductor memory is performed such that activation/deactivation of the deep power down mode are determined in accordance with signals applied through various ports in the plurality of ports.

7 Claims, 14 Drawing Sheets

FIG. 14

METHOD CONTROLLING DEEP POWER DOWN MODE IN MULTI-PORT SEMICONDUCTOR MEMORY

CROSS-REFERENCE TO RELATED APPLICATION

This U.S. non-provisional patent application claims the benefit of Korean Patent Application 10-2009-0049067 filed on Jun. 3, 2009, the subject matter of which is hereby incorporated by reference.

BACKGROUND

The present inventive concept relates to semiconductor memories. More particularly, the inventive concept relates to a method of controlling a deep power down mode in a multi-port semiconductor memory.

Semiconductor devices, such as a dynamic random access memory (DRAM) and the like, are often used as the main memory element in various electronic systems. Within many contemporary applications, semiconductor memories are required to operate at high speed. Additionally, a very high degree of integration density is demanded for semiconductor memories.

In recent years, semiconductor memories have been increasingly used in mobile electronic devices, such as a mobile phones or the like. In this capacity, multi-port semiconductor memories allow a plurality of computational or logic components (generically hereafter "processors") to access internal memory banks via through different data input/output (I/O) ports. Additionally, the conservation of power, especially battery power, is critical to the commercial success of mobile electronic devices. Accordingly, these devices are configured to operate in a so-called "deep power down mode" of operation in which a minimum of power is consumed. Thus, in multi-port semiconductor memories, the efficient control (i.e., entering and exiting) of a deep power down mode is important in operating aspect.

In conventional semiconductor memories, a "standby mode" of operation is provided in which power consumption is greatly reduced, as compared with an active mode of operation. However, if a semiconductor memory remains in the standby mode for a defined period of time, it may enter the deep power down mode of operation in which power consumption is further reduced. For example, certain peripheral circuits may be fully disabled upon entering the deep power down mode.

The activation (i.e., entering) and deactivation (exiting) of a deep power down mode is further complicated when a multi-port semiconductor memory is used in a particular host device. That is, since a plurality of processors may access data from the internal memory banks via different ports under different conditions in a mobile host device, the definition, timing, and inter-processor coordination of deep power down mode activation/deactivation must be carefully considered.

SUMMARY

Embodiments of the inventive concept provide a control method capable of efficiently activating/deactivating a deep power down mode in a multi-port semiconductor memory. Embodiments of the inventive concept also provide a method efficiently controlling activation/deactivation of a deep power down mode in a multi-port semiconductor memory allowing a plurality of processors to access internal memory banks via different ports.

An aspect of the inventive concept provides a method controlling a deep power down (DPD) mode of operation for a multi-port semiconductor memory having a plurality of ports respectively connected to a plurality of processors comprises; activating the DPD mode in the multi-port semiconductor memory in response to control signals received via a first port in the plurality of ports, and deactivating the DPD mode in the multi-port semiconductor memory in response to control signals received via the first port in the plurality of ports.

In another aspect of the inventive concept a method of controlling a deep power down (DPD) mode of operation for a multi-port semiconductor memory having a plurality of ports respectively connected to a plurality of processors comprises; activating the DPD mode in the multi-port semiconductor memory in response to control signals received via a first port in the plurality of ports, and deactivating the DPD mode in the multi-port semiconductor memory in response to control signals received via a second port in the plurality of ports different from the first port.

In another aspect of the inventive concept a method of controlling a deep power down (DPD) mode of operation for a multi-port semiconductor memory having a plurality of ports respectively connected to a plurality of processors comprises; activating the DPD mode in the multi-port semiconductor memory in response to control signals received via all the plurality of ports, and deactivating the DPD mode in the multi-port semiconductor memory in response to a control signal arbitrarily received via a first port in the plurality of ports.

In another aspect of the inventive concept a method of controlling a deep power down (DPD) mode of operation for a multi-port semiconductor memory having a plurality of ports respectively connected to a plurality of processors comprises; activating the DPD mode in the multi-port semiconductor memory and enabling a flag in accordance with a first signal applied via a set port in the plurality of ports, and deactivating the DPD mode in the multi-port semiconductor memory and disabling the flag in accordance with a second signal applied via an arbitrary port in the plurality of ports.

BRIEF DESCRIPTION OF THE DRAWINGS

The above and other features and advantages will become more apparent by describing in detail embodiments thereof with reference to the attached drawings in which.

DETAILED DESCRIPTION OF EMBODIMENTS

Embodiments of the inventive concept will now be described in some additional detail with reference to the accompanying drawings. Specific structural and functional details disclosed herein are merely representative for purposes of describing the selected embodiments. The inventive concept may be variously embodied and should not be construed as being limited to only the illustrated embodiments. The illustrated embodiments are drawn to examples assuming a DRAM incorporating the novel teachings of the inventive concept. However, other types of volatile and nonvolatile memories may incorporate these teachings and are contemplated within the scope of the inventive concept. Throughput the working examples that follow, a working knowledge of conventionally understood DRAM configurations and operations (e.g., voltage generation operations) will be assumed as a descriptive predicate, and such basic information will not be reiterated in the description that follows.

Accordingly, it will be understood that the following embodiments are capable of modification and implementation in alternative forms. Such modifications, equivalent embodiments and alternative implementations are deemed to fall within the scope of the inventive concept. Throughout the written description and drawings, like reference numbers and labels are used to denote like or similar elements.

It will be understood that, although the terms first, second and third may be used herein to describe various elements, these elements should not be limited by these terms. These terms are only used to distinguish one element from another. For example, a first element could be termed a second element, and, similarly, a second element could be termed a first element, without departing from the scope of inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular embodiments only and is not intended to be limiting of embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which embodiments belongs. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Figure 1:
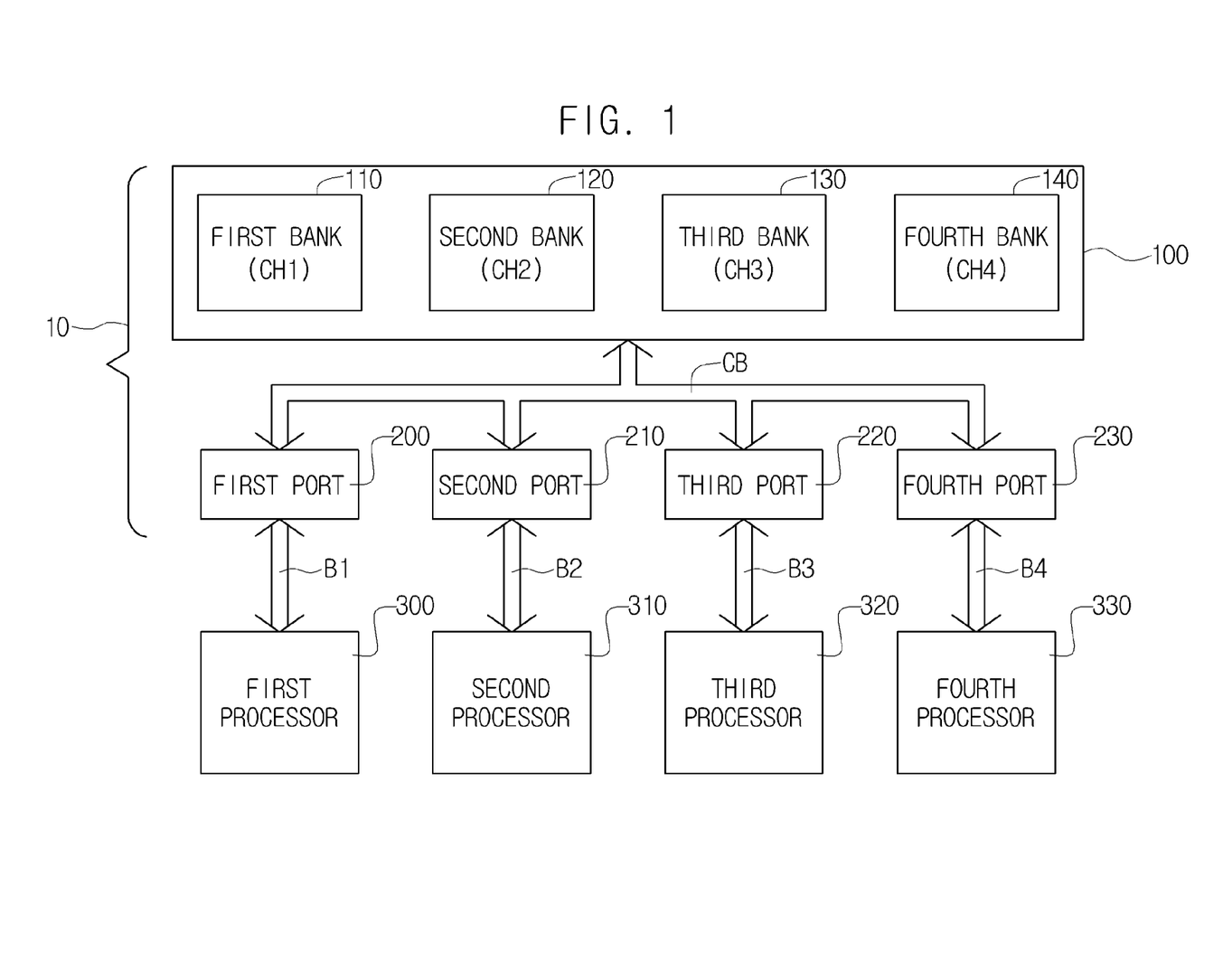
FIG. 1 is a block diagram of a multi-port semiconductor memory.

Figure (FIG.) 1 is a block diagram of a multi-port semiconductor memory. Referring to FIG. 1, a multi-port semiconductor memory 10 is configured such that a memory cell array 100 has four banks 110, 120, 130, and 140, and four ports 200, 210, 220, and 230 are connected to a system bus CB. First, second, third, and fourth processors 300, 310, 320, and 330 are correspondingly connected to the first, second, third, and fourth ports 200, 210, 220, and 230 through buses B1, B2, B3, and B4. Thus, the first, second, third, and fourth processors 300, 310, 320, and 330 can respectively access the four banks 110, 120, 130, and 140 through the ports allocated thereto so as to read/write data.

The four banks 110, 120, 130, and 140 include DRAM cells requiring a periodic refresh. Accordingly, for power saving, when a standby mode is maintained for a defined period of time, a deep power down (DPD) mode is activated (i.e. entered). In the DPD mode, for example, certain peripheral circuits are disabled.

Figure 2:
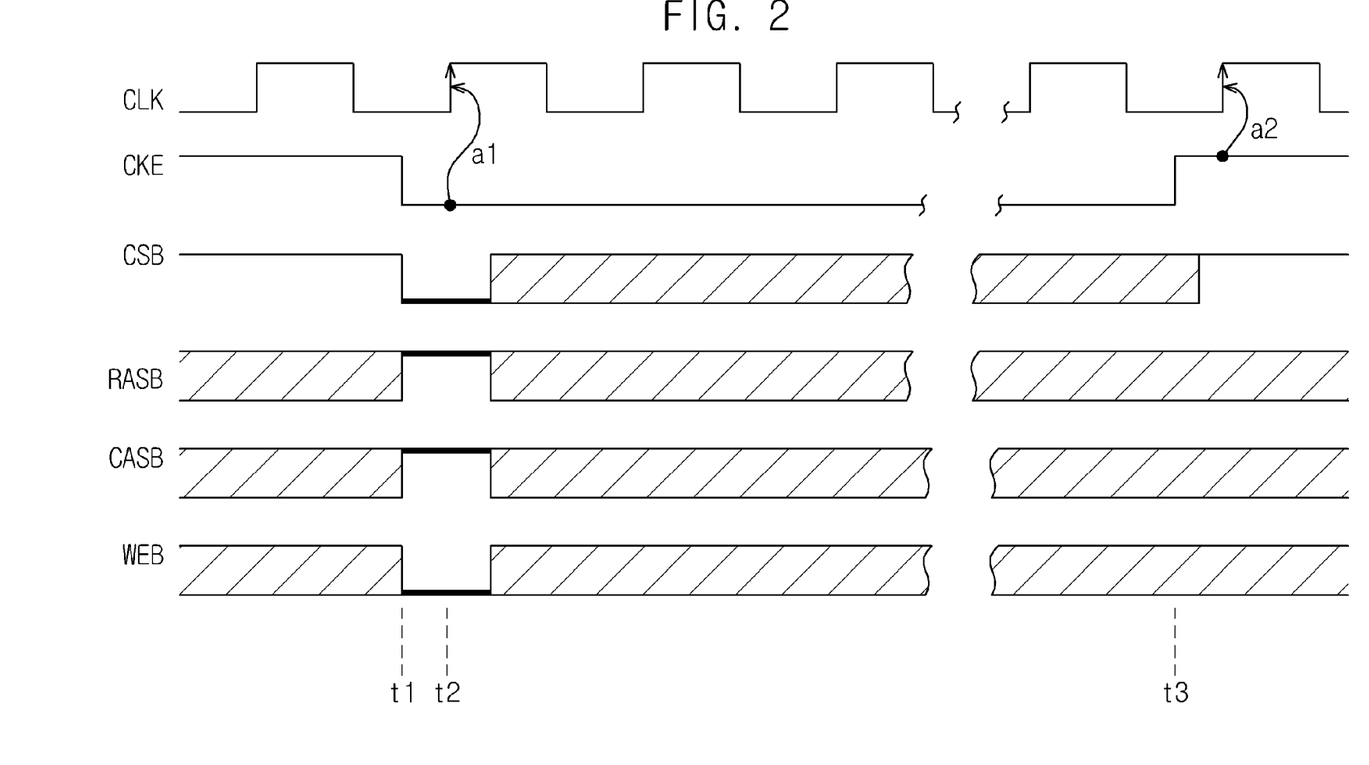
FIG. 2 is a timing diagram illustrating activation/deactivation of a deep power down mode.

FIG. 2 is a timing diagram for signals controlling the activation/deactivation of the DPD mode within the DRAM of FIG. 1. Referring to FIG. 2, activation of the DPD mode is indicated by an arrow a1 at time t2. That is, after time t1, a clock enable signal CKE is at a logical "low" level, and a chip selection signal CSB and a write enable signal WEB are low. Then, in a state where row and column address strobe signals RASB and CASB are "high", when a clock signal CLK transitions from low to high at the time t2, the DPD mode is activated.

Meanwhile, the DPD mode is deactivated (i.e., exited) according to the timing indicated by the arrow a2 when, after time t3, the clock enable signal CKE is high, and the clock signal CLK transitions from low to high. As shown in the drawing, the logic levels of signals other than the clock enable signal CKE has no effect on the deactivation of the DPD mode.

Figure 3:
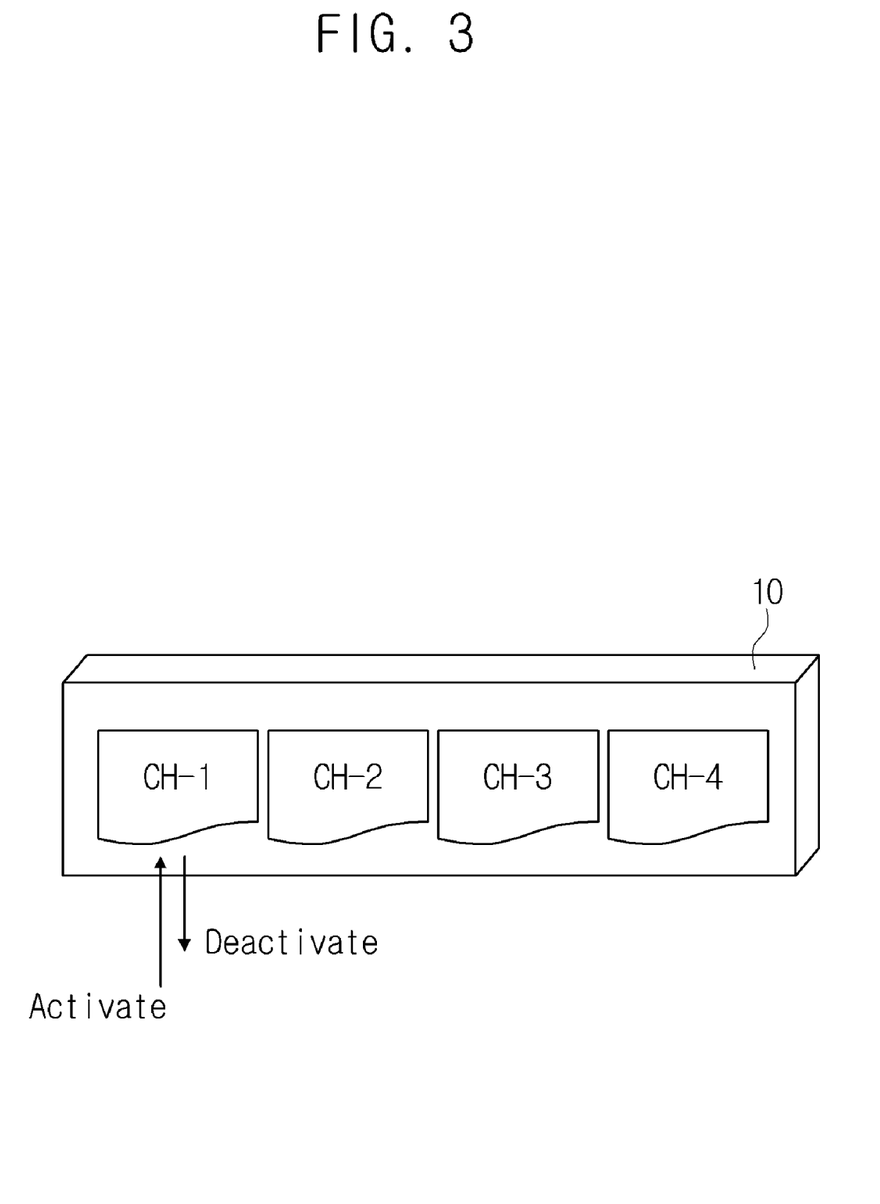
FIGS. 3 and 4 are diagrams conceptually illustrating activation/deactivation of a deep power down mode by channel for the semiconductor memory of FIG. 1.
Figure 4:
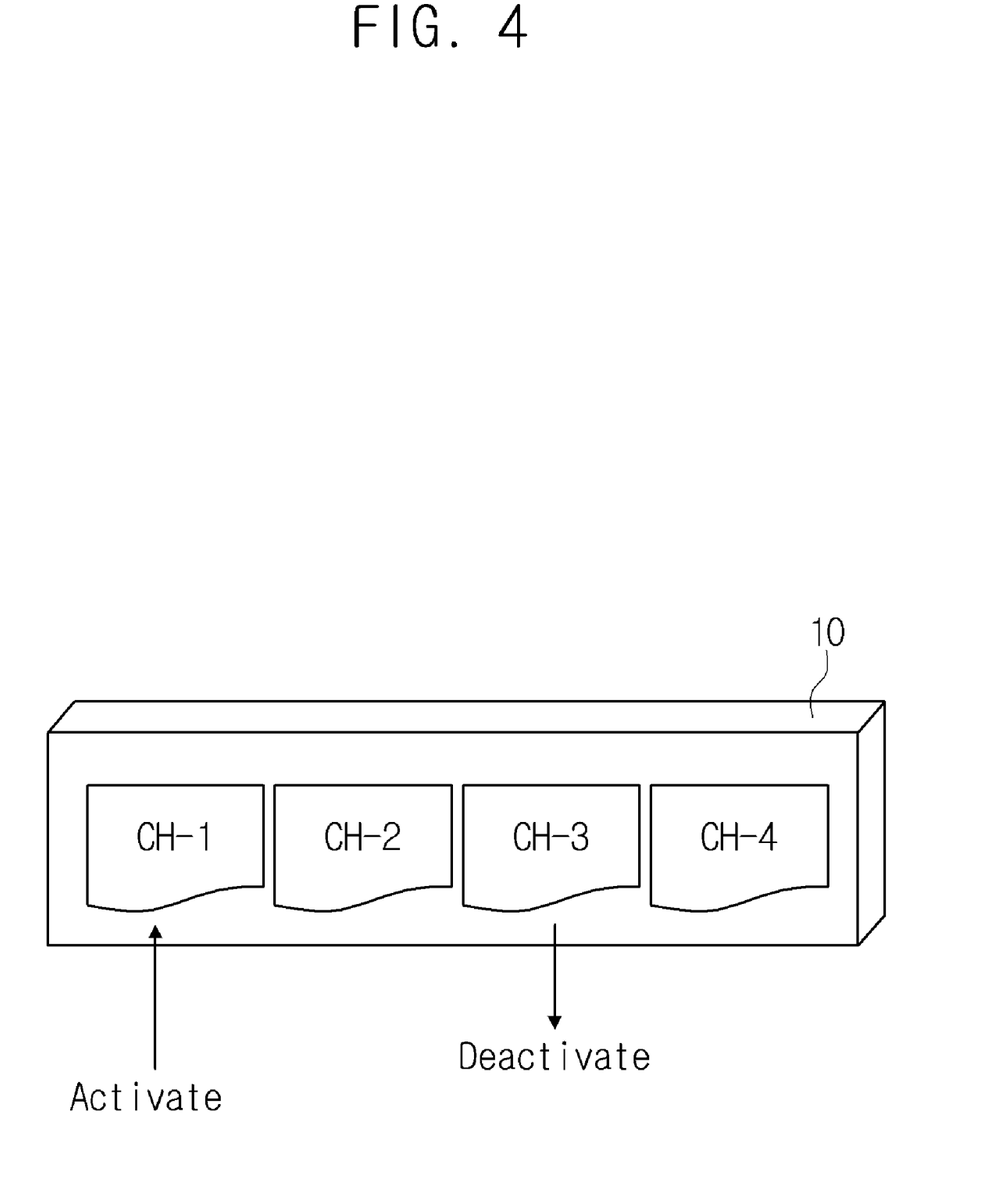

FIGS. 3 and 4 are diagrams conceptually illustrating the activation/deactivation of the DPD mode by channel within the semiconductor memory of FIG. 1.

FIG. 3 illustrates a case wherein the activation/deactivation of the DPD mode described with reference to FIG. 2 is performed via the same single channel (or data I/O port). For example, when the signals of FIG. 2 are applied via a first channel, that is, the first port 200 of FIG. 1, the activation/deactivation of the DPD mode may be performed.

FIG. 4 illustrates a case wherein the activation/deactivation of the DPD mode described with reference to FIG. 2 is performed via different channels (or data I/O ports). For example, when the signals of FIG. 2 are applied via a first channel, that is, the first port 200 of FIG. 1, the DPD mode is activated, and when the signals of FIG. 2 are applied via a second channel, that is, the third port 220 of FIG. 1, the DPD mode is deactivated.

Each of the methods illustrated in FIGS. 3 and 4 has its own merits and drawbacks, but may be used within operative context of a particular multi-port semiconductor memory and a particular application.

Figure 5:
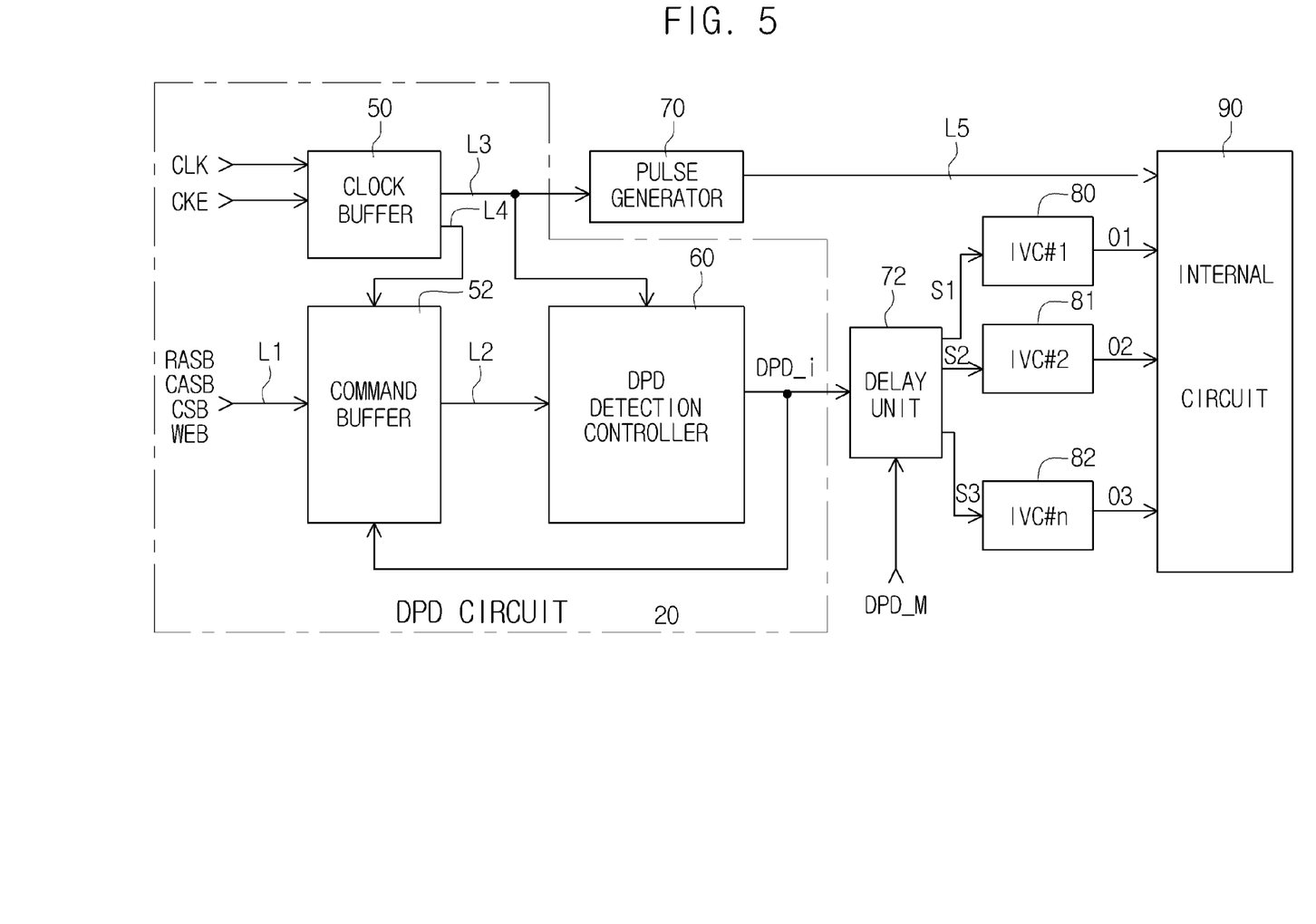
FIG. 5 is a diagram of a deep power down circuit incorporated within an embodiment of the inventive concept.

FIG. 5 is a block diagram of a circuit including a DPD circuit 20 susceptible to incorporation within certain embodiments of the inventive concept. Referring to FIG. 5, the DPD circuit 20 comprises a clock buffer 50, a command buffer 52, and a DPD detection controller 60.

The clock buffer 50 receives the clock enable signal CKE shown in FIG. 2 as an external power down command signal, as well as the clock signal CLK. The clock buffer 50 provides an internal clock enable signal ICKE via a line L4, and a DPD deactivation command signal via a line L3.

The command buffer 52 receives the signals shown in FIG. 2, that is, the row and column address strobe signals RASB and CASB, the chip selection signal CSB, and the write enable signal WEB via a line L1, as well as the internal clock enable signal ICKE via the line L4. The command buffer 52 provides a DPD activation command signal via a line L2.

The DPD detection controller 60 receives the DPD deactivation command signal and DPD activation command signal, and provides a DPD detection control signal DPD_i for DPD activation/deactivation.

The DPD detection control signal DPD_i is provided as driving control signals S1, S2, and S3 by a delay unit 72. For example, three internal power voltage generators 80, 81, and 82 shown in FIG. 5 may correspond to generators that generate a plate voltage, an internal array power voltage, a substrate bias voltage, an internal peripheral voltage [VINTP], a boost voltage, and the like. To this end, the internal power voltage generators 80, 81, and 82 receive various bias voltages and reference voltages.

A pulse generator 70 receives the DPD deactivation command signal from the clock buffer 50 via the line L3, and generates auto pulses (AP). The auto pulses (AP) are transmitted to an internal circuit 90 via a line L5 to initialize ON states for various internal circuits (e.g., internal circuit 90). The auto pulses (AP) may be applied to latch circuit nodes the internal circuit 90 of the multi-port semiconductor memory.

Upon activation of the DPD mode with the signal timing shown in FIG. 2, the DPD detection control signal DPD_i is enabled. When this happens, the internal power voltage generators 80, 81, and 82 are turned OFF, and the output voltage drops to VSS or ground level. Thus, a very small amount of current is consumed. Further, the command buffer 52 and various input buffers are turned OFF and placed in the DPD mode.

If the clock enable signal CKE transitions from low to high for the DPD deactivation with the signal timing shown in FIG. 2, the DPD detection control signal DPD_i is disabled by the detection operation of the DPD detection controller 60. When this happens, the internal power voltage generators 80, 81, and 82 are turned ON, and the output voltage rises to a set target voltage. Further, the command buffer 52 and various input buffers are turned ON and are placed in a set (or active) operating mode.

According to certain embodiments of the inventive concept, a DPD master signal DPD_M is applied to the delay unit 72, regardless of the application of the DPD detection control signal DPD_i, so the activation/deactivation of the DPD mode in the multi-port semiconductor memory may be controlled as a whole.

Figure 6:
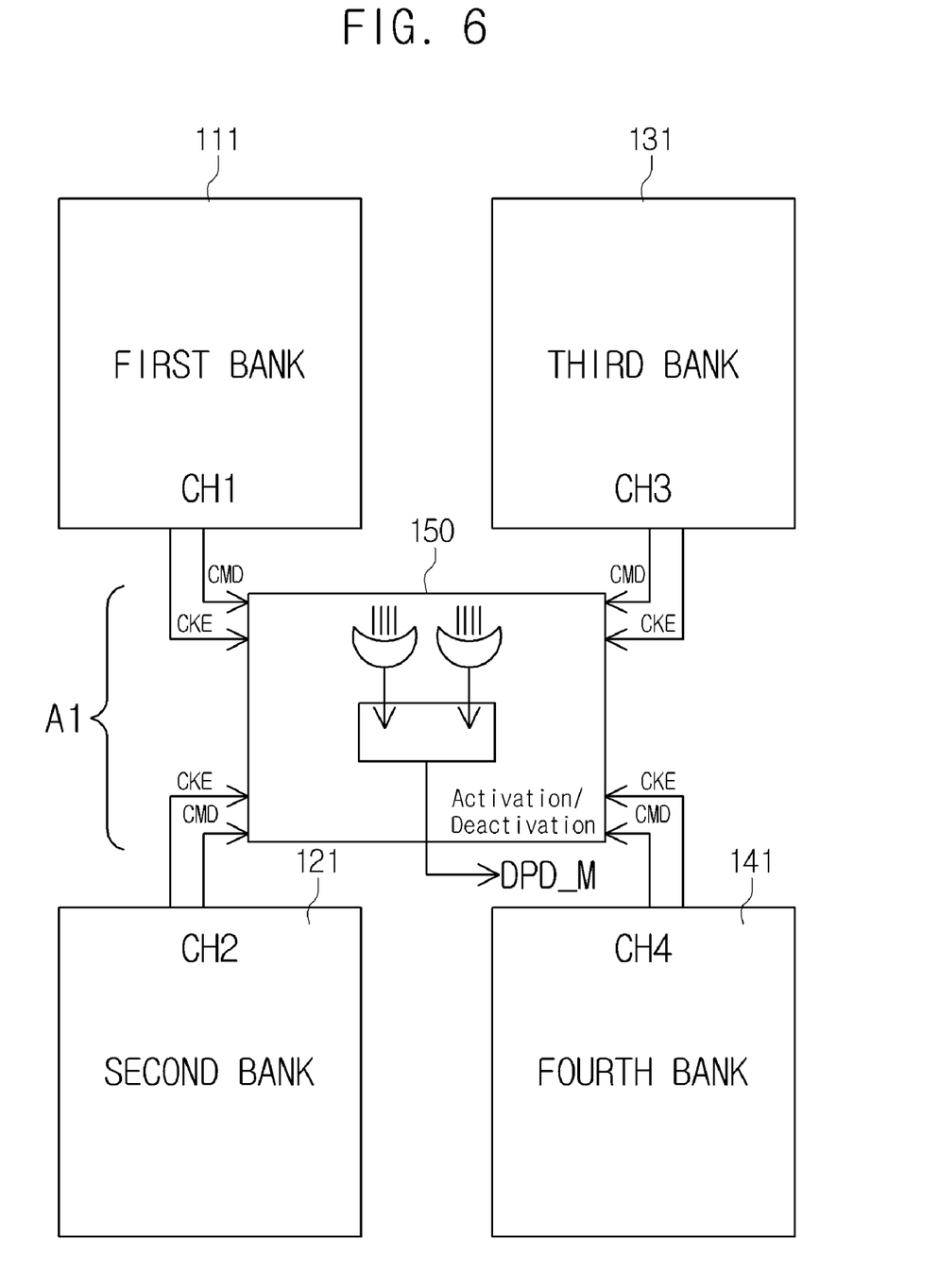
FIG. 6 is a block diagram of a circuit enabling the deep power down method according to an embodiment of the inventive concept.

FIG. 6 is a block diagram of a circuit enabling a DPD control method according to an embodiment of the inventive concept. Referring to FIG. 6, four banks 111, 121, 131, and 141 are connected to a DPD signal generator 150. The four banks 111, 121, 131, and 141 are disposed in a region of the memory cell array 100 (FIG. 1), and the DPD signal generator is disposed in the common region A1 of the multi-port semiconductor memory.

Figure 7:
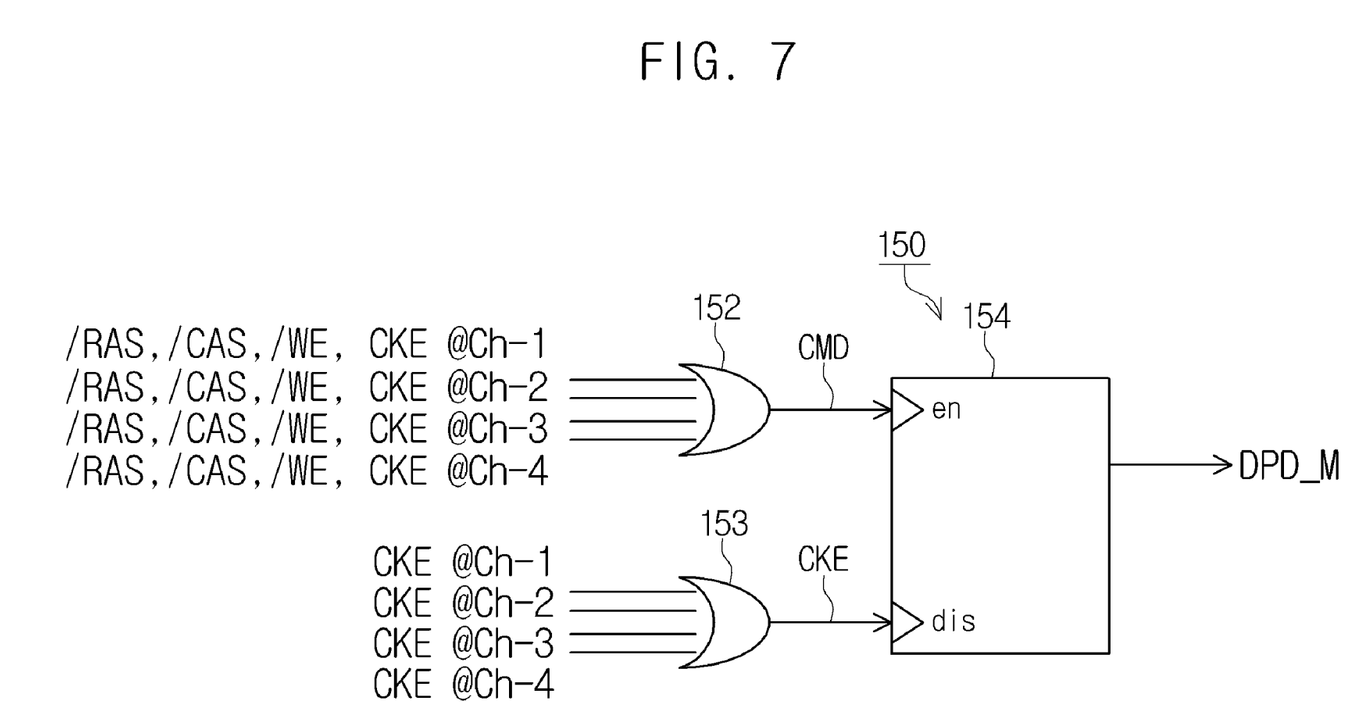
FIG. 7 is a circuit diagram further illustrating the deep power down signal generator of FIG. 6.

As shown in FIG. 7, the DPD signal generator 150 includes OR gates 152 and 153, and a master signal generator 154. The DPD signal generator 150 generates the DPD master signal DPD_M.

FIG. 7 is a more detailed view of one possible example of the DPD signal generator of FIG. 6. Defined control signals, such as /RAS (RASB), /CAS, /WE, and CKE may be supplied via respective channels and applied to the OR gate 152. The CKE control signal may be supplied via each channel and applied to the OR gate 153. Thus, the master signal generator 154 having an enable terminal (en) connected to the output (CMD) of the OR gate 152 generates the DPD master signal DPD_M for activating the DPD mode in response to a DPD command first applied thereto through any port (or channel). That is, if /RAS (RASB), /CAS, /WE, and CKE are applied according to the DPD mode activation timing through an arbitrary port, for example, the third port, the master signal generator 154 generates the DPD master signal DPD_M for DPD mode activation in response to a DPD command applied through the third port.

The master signal generator 154 having a disable terminal (dis) connected to the output (CKE) of the OR gate 153 generates the DPD master signal DPD_M for DPD mode deactivation in response to CKE first applied thereto through any port (channel). That is, if CKE is applied with DPD deactivation timing (e.g., transition from low to high) through an arbitrary port, for example, the second port, the master signal generator 154 generates the DPD master signal DPD_M for DPD mode deactivation in response to CKE applied through the second port. In certain embodiments, the master signal generator 154 may be implemented by a typical D flip-flop circuit having an enable terminal and a disable terminal.

Consequently, in FIG. 6, the activation/deactivation of the DPD mode may be determined in accordance with signals applied via different ports using the same conceptual framework as FIG. 4.

Figure 10:
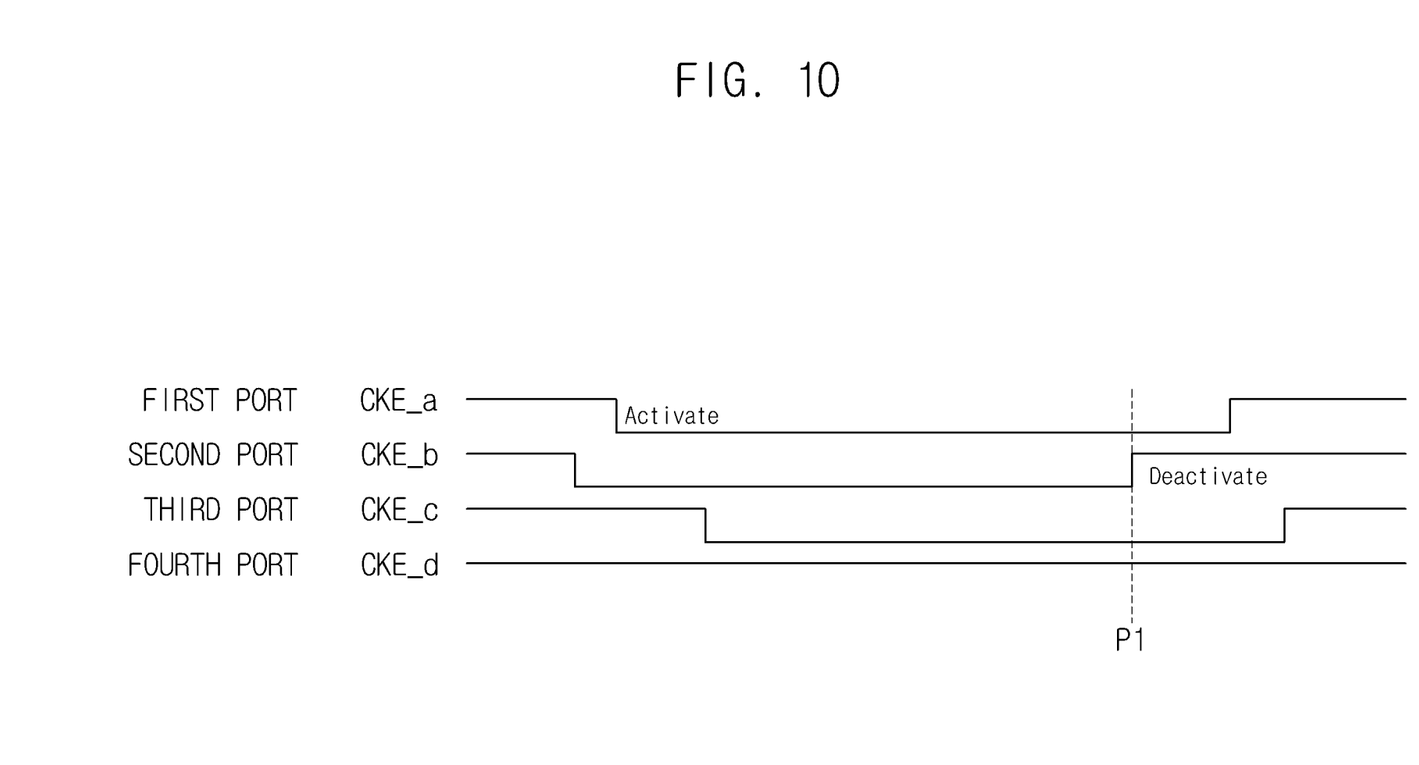
FIG. 10 is a timing diagram further illustrating signals for the activation/deactivation of the deep power down mode of FIG. 6.

FIG. 10 is a timing diagram illustrating certain control signals for the activation/deactivation of the DPD mode of FIG. 6. Referring to FIG. 10, activation of the DPD mode may be achieved in accordance with a DPD command applied through the first port (first channel), and deactivation of the DPD mode may be achieved at time P1 in accordance with CKE applied through the second port (second channel).

Figure 8:
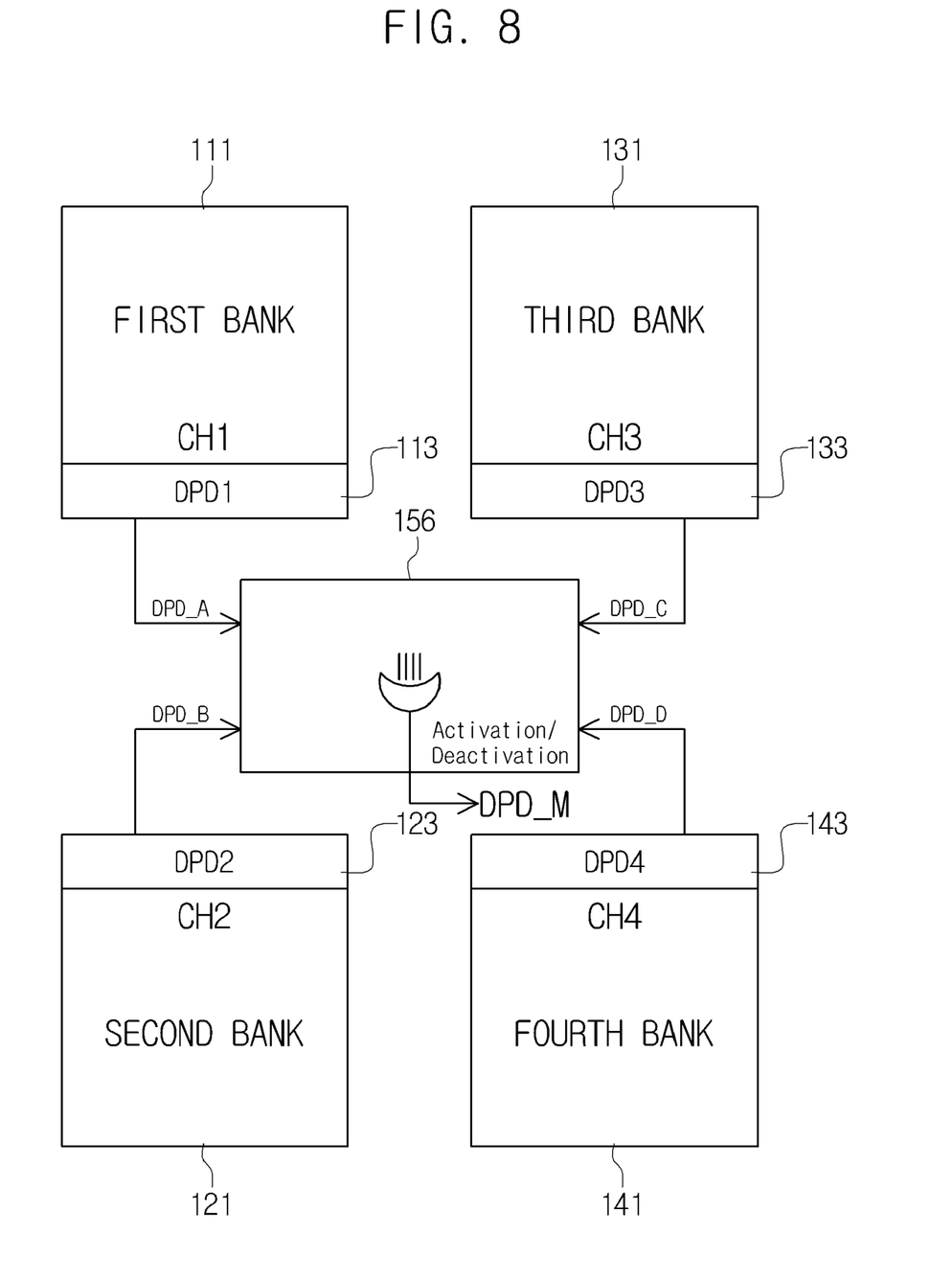
FIG. 8 is a block diagram of a circuit enabling the deep power down method according to another embodiment of the inventive concept.
Figure 9:
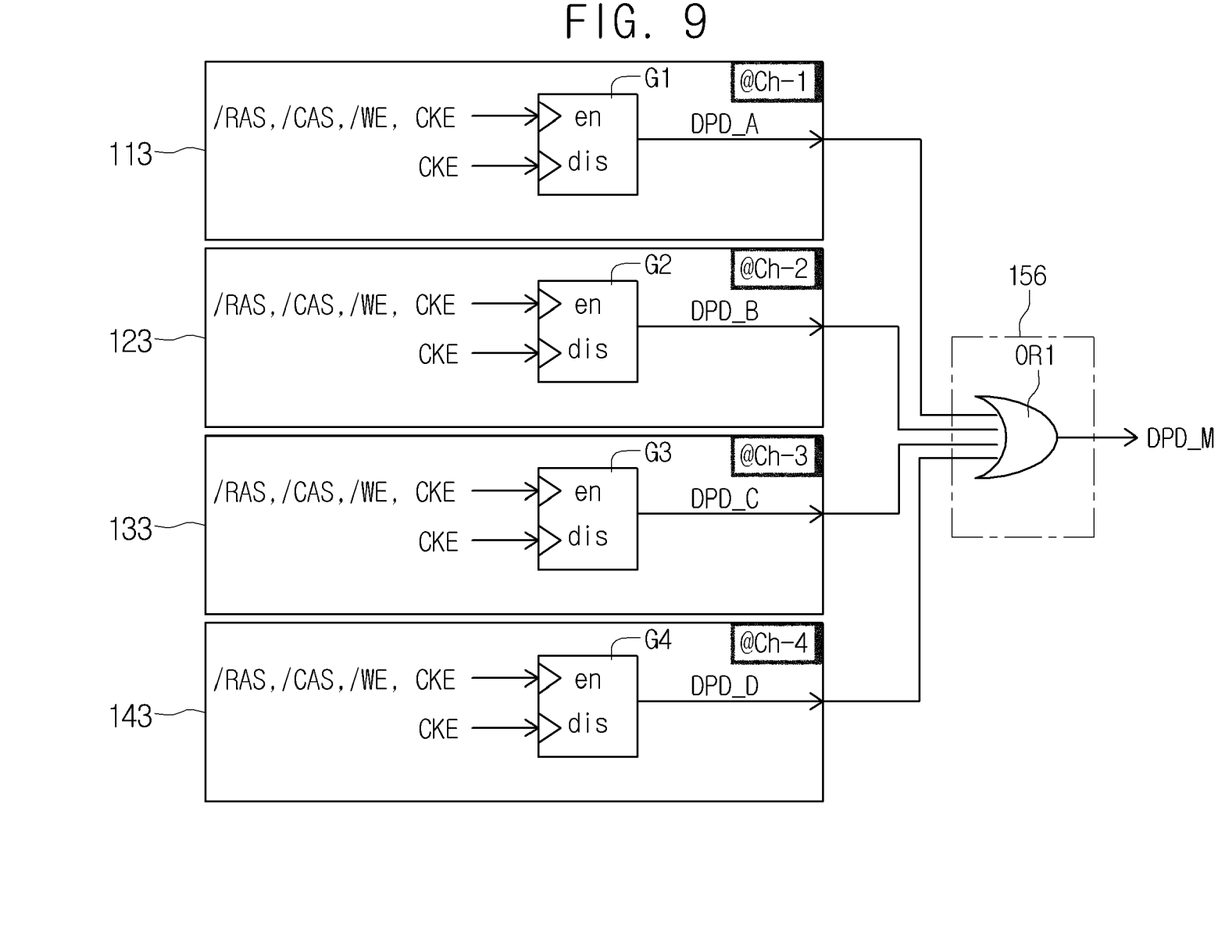
FIG. 9 is a circuit diagram further illustrating the deep power down circuit and signal generator of FIG. 8.

Another embodiment of the inventive concept will now be described with reference to FIG. 8. FIG. 8 is a block diagram of a circuit enabling a DPD control method according to another embodiment of the inventive concept. FIG. 9 is a more detailed view of one possible example of the DPD circuit and signal generator of FIG. 8.

Referring to FIG. 8, four banks 111, 121, 131, and 141 respectively having DPD circuits 113, 123, 133, and 143 are connected to a DPD signal generator 156. The DPD signal generator 156 is disposed in the common region A1 of the multi-port semiconductor memory.

The DPD circuits 113, 123, 133, 143 respectively have circuit elements illustrated in FIG. 7 and generate DPD local signals DPD_A, DPD_B, DPD_C, and DPD_D.

As shown in FIG. 9, the DPD signal generator 156 includes an OR gate OR1, and generates the result of an OR operation on the DPD local signals DPD_A, DPD_B, DPD_C, and DPD_D as the DPD master signal DPD_M.

Therefore, the circuit of FIG. 8 is configured such that the activation/deactivation of the DPD mode may be determined in accordance with signals applied via the same port. Note that activation of the DPD mode is performed via a port which first supplies the DPD command, and deactivation of the DPD mode is performed after CKE applied through the port used for activation of the DPD mode transitions from low to high.

Figure 12:
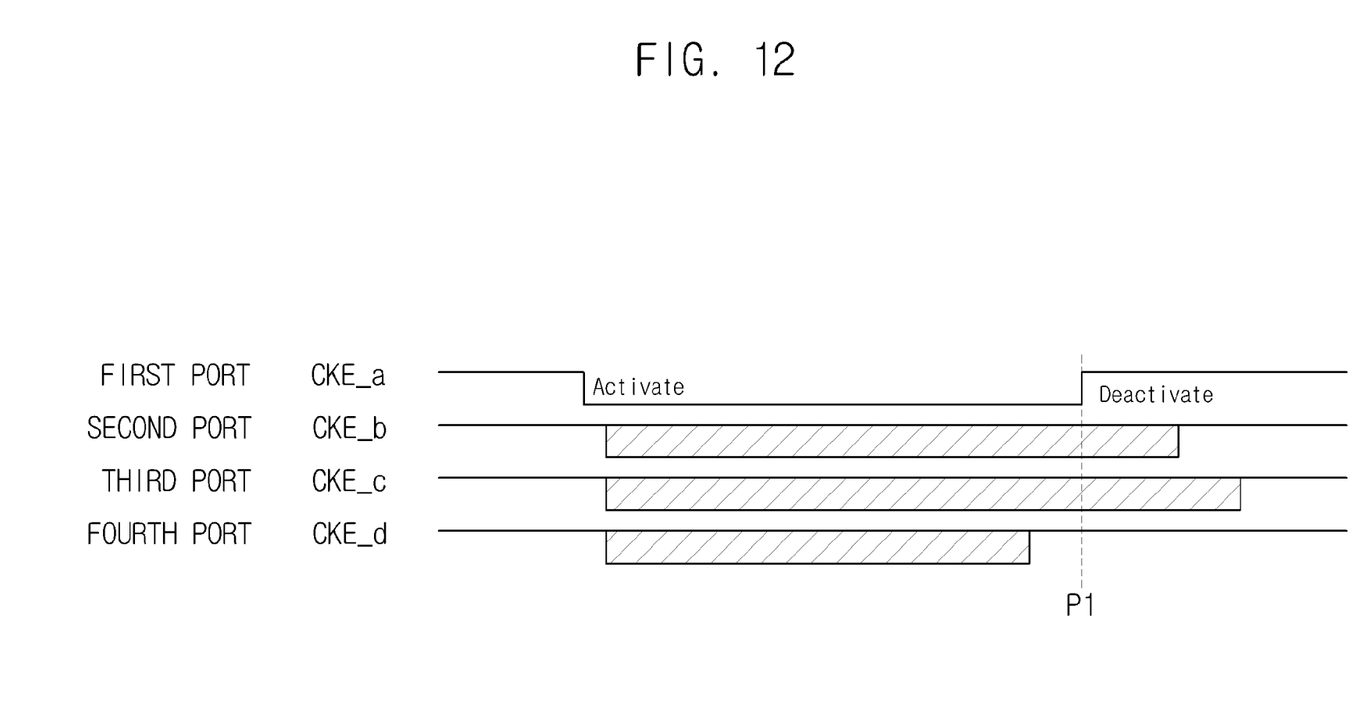
FIG. 12 is a timing diagram further illustrating signals for the activation/deactivation of the deep power down mode of FIG. 8.

FIG. 12 is a timing diagram of signals controlling the activation/deactivation of the DPD mode of FIG. 8. Referring to FIG. 12, activation of the DPD mode is performed in accordance with the DPD command applied through the first port (first channel), and the deactivation of the DPD mode is performed at the time P1 in accordance with CKE applied through the first port (first channel). In FIG. 12, the activation/deactivation of the DPD mode is performed in accordance with the signals applied through the first port. Alternatively, activation of the DPD mode may be performed in accordance with the DPD command first applied through one of the second, third, and fourth ports, and deactivation of the DPD mode may be performed in accordance with CKE applied through the same port through which the DPD command is applied.

Figure 11:
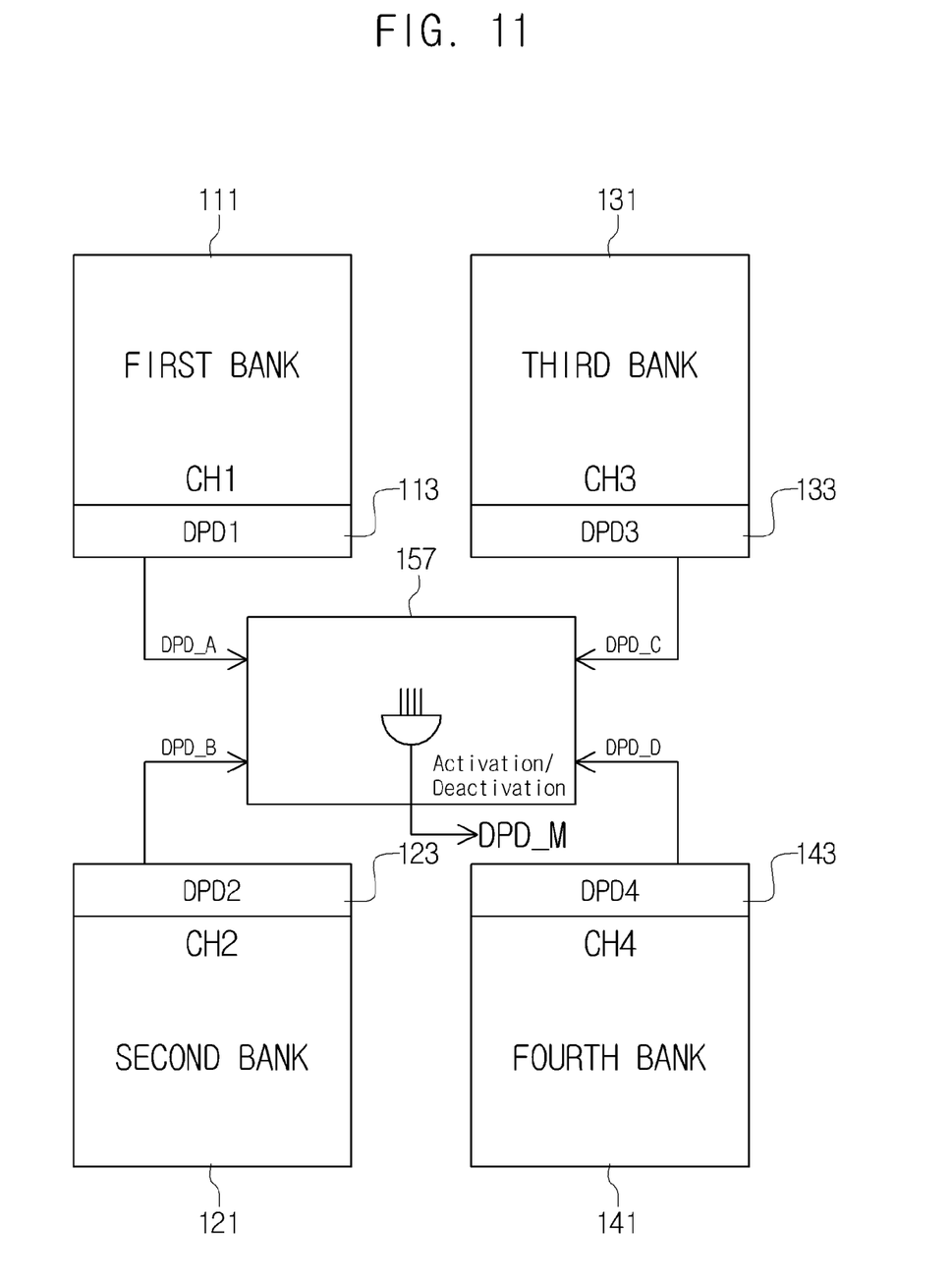
FIG. 11 is a block diagram of a circuit enabling the deep power down method according to yet another embodiment of the inventive concept.

Yet another embodiment of the inventive concept will now be described with reference to FIG. 11. FIG. 11 is a block diagram of a circuit enabling the DPD mode control method according to an embodiment of the inventive concept. Referring to FIG. 11, four banks 111, 121, 131, 141 respectively having DPD circuits 113, 123, 133, and 143 are connected to a DPD signal generator 157. The DPD signal generator 157 is disposed in the common region A1 of the multi-port semiconductor memory, as shown in FIG. 6.

As in FIG. 8, the DPD circuits 113, 123, 133, 143 respectively have circuit elements shown in FIG. 7, and generate DPD local signals DPD_A, DPD_B, DPD_C, and DPD_D.

The DPD signal generator 157 shown in FIG. 11 includes an AND gate, instead of the OR gate OR1 shown in FIG. 9. The DPD signal generator 157 generates the result of an AND operation on the DPD local signals DPD_A, DPD_B, DPD_C, and DPD_D as the DPD master signal DPD_M.

Therefore, the circuit of FIG. 11 is configured such that the activation of the DPD mode is performed when the DPD command is supplied through all the ports (or channels), and the deactivation of the DPD mode is performed when CKE is supplied high through all the ports. As a result, when the DPD command is supplied through all the first, second, third, and fourth ports, the entrance to the DPD mode is performed.

Still another embodiment of the inventive concept will now be described with reference to FIGS. 13 and 14.

Figure 13:
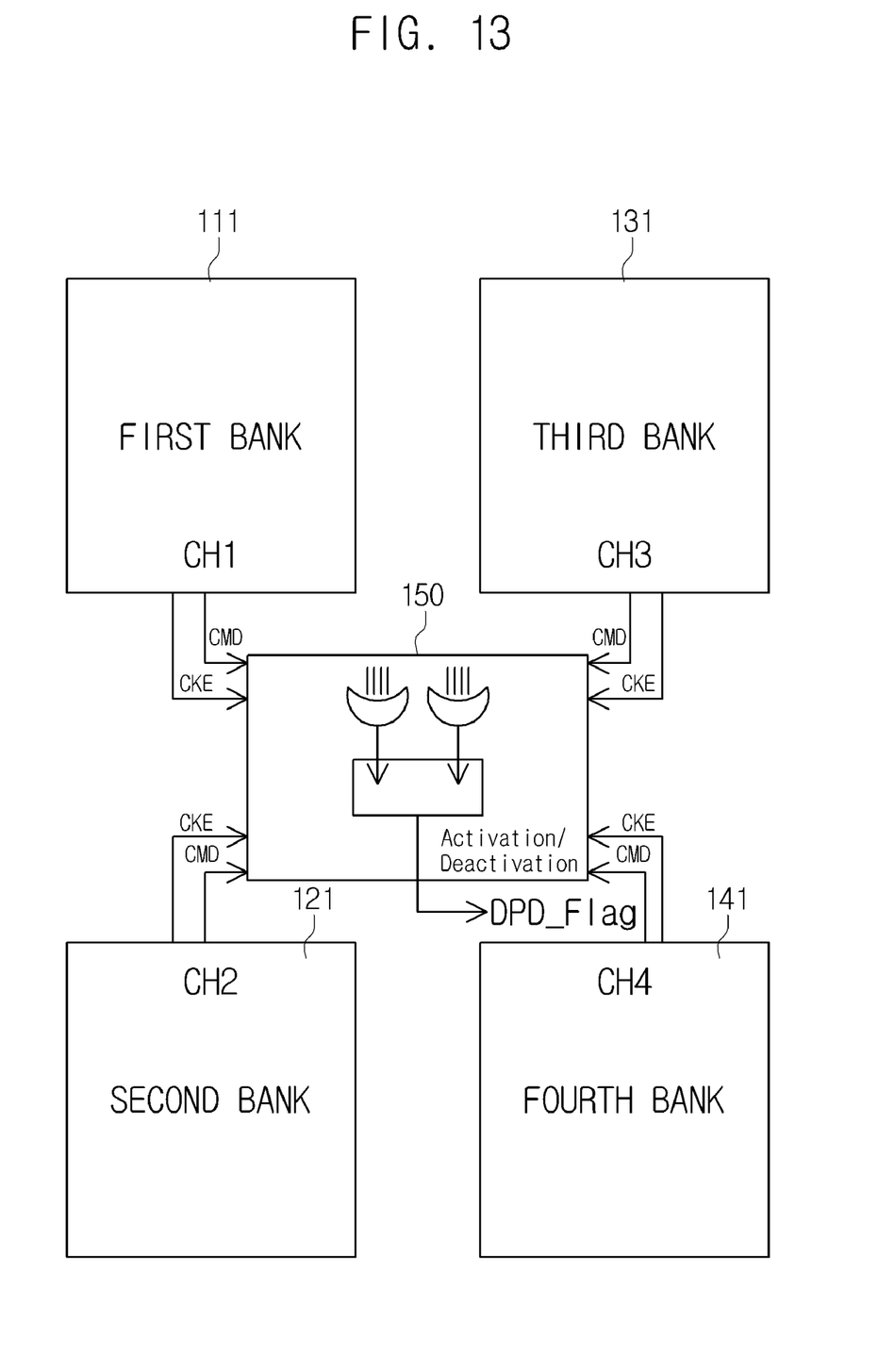
FIG. 13 is a block diagram of a circuit enabling the deep power down method according to still another embodiment of the inventive concept.

FIG. 13 is a block diagram of a circuit enabling the DPD mode control method according to another embodiment of the inventive concept. This circuit has substantially the same circuit configuration as the circuit of FIG. 6, except that a DPD flag signal DPD_Flag, not the DPD master signal DPD_M, is generated.

Figure 14:
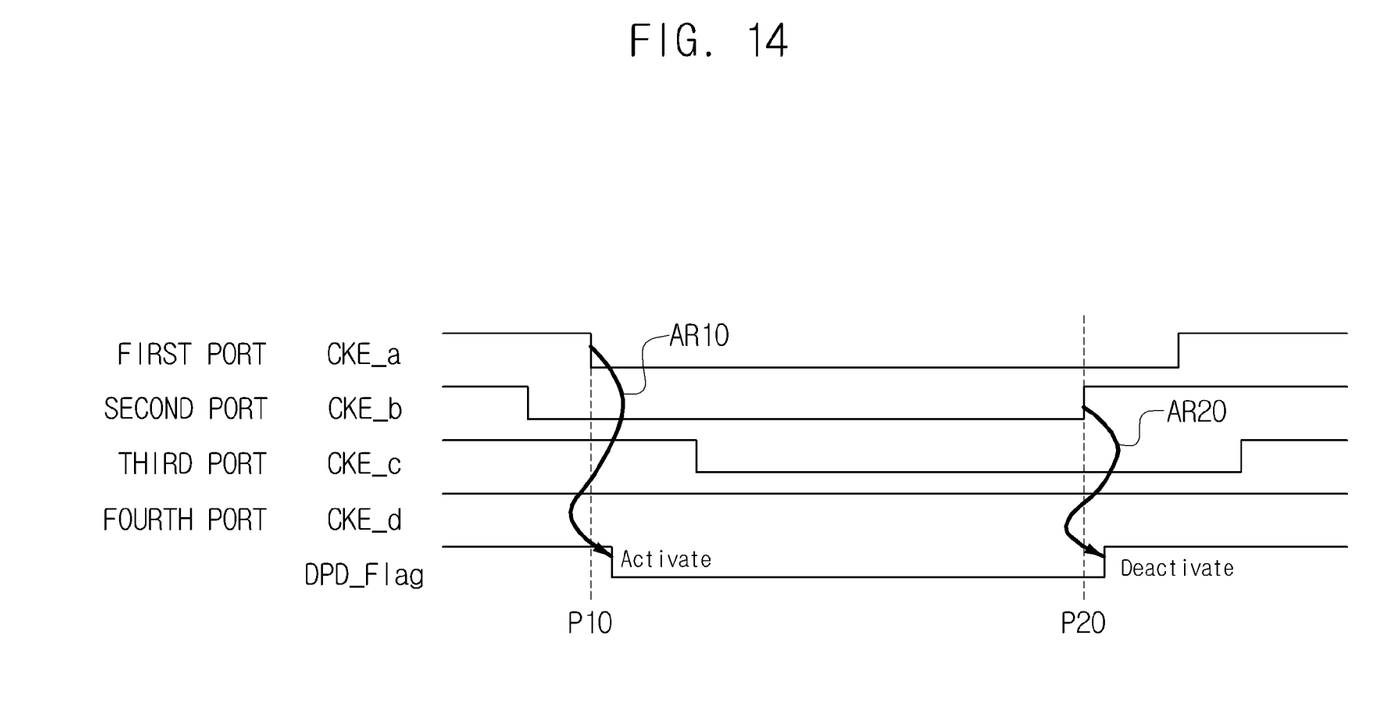
FIG. 14 is a timing diagram further illustrating signals for the activation/deactivation of the deep power down mode of FIG. 13.

FIG. 14 is a timing diagram of control signals controlling the activation/deactivation of the DPD mode in FIG. 13. Referring to FIG. 14, it can be seen that, as indicated by an arrow AR10, the DPD flag signal DPD_Flag is activated low after time P10 in response to activation of the DPD mode. Further, it can be seen that, as indicated by an arrow AR12, the DPD flag signal DPD_Flag is deactivated high after time P20 in response to deactivation of the DPD mode. FIG. 14 shows a case wherein the activation of the DPD mode is achieved via the first port, and deactivation of the DPD mode is achieved via the second port.

The DPD flag signal DPD_Flag is applied to the corresponding processor or chip set, so the processor or chip set can recognize the activation/deactivation of the DPD mode.

Although in the illustrated embodiments of the inventive concept, the activation/deactivation of the DPD mode is performed according to the exemplary protocol shown in FIG. 2, this is just one example of many other protocols that may be used. For example, control signals such as WEB, RASB, and CASB, may have inverted levels from those shown in the illustrated embodiments. Alternately, the trigger control signal CKE may not be used. An arbitrary signal corresponding to the clock enable signal CKE may be used as a signal for DPD mode activation/deactivation. The use of the DPD mode is permitted when the multi-port semiconductor memory is inactivated, and during the DPD mode, the internal power supply of the multi-port semiconductor memory is powered down.

As described above, the activation/deactivation of the DPD mode in the multi-port semiconductor memory having a plurality of ports can be implemented in various ways. Therefore, an optimum control method can be selected in accordance with the specific application of the multi-port semiconductor memory.

Although the illustrated embodiments of the inventive concept have been described with reference to the drawings, it will be obvious to those skilled in the art that various changes and modifications may be made without departing from the scope of the inventive concept. For example, in certain cases, an apparatus configuration or signal timing for the activation/deactivation of the DPD mode may be modified without departing from the scope of the inventive concept.

Although a case where the inventive concept has been applied to a multi-port semiconductor memory has been described, the inventive concept may be applied to a volatile semiconductor memory or nonvolatile semiconductor memory apparatus having two or more ports.

What is claimed is:

1. A method of controlling a deep power down (DPD) mode of operation for a multi-port semiconductor memory having a plurality of memory banks and a plurality of input/output (I/O) ports, the plurality of I/O ports being respectively connected to a plurality of processors, the method comprising:
    activating the DPD mode in the multi-port semiconductor memory in response to at least one control signal received via a first port in the plurality of I/O ports, wherein the first port is any one of the plurality of I/O ports; and
    deactivating the DPD mode in the multi-port semiconductor memory in response to at least one control signal received via a second port in the plurality of I/O ports, wherein the second port is any remaining one of the plurality of I/O ports different from the first port.

2. The method of claim 1, wherein activation of the DPD mode is determined when a first control signal is arbitrarily applied via the first port, and deactivation of the DPD mode is determined when a second control signal is arbitrarily applied the second port.

3. A method of controlling a deep power down (DPD) mode of operation for a multi-port semiconductor memory having a plurality of memory banks and a plurality of input/ output (I/O) ports, the plurality of I/O ports being respectively connected to a plurality of processors, the method comprising:

activating the DPD mode in the multi-port semiconductor memory in response to control signals received via all the plurality of I/O ports; and deactivating the DPD mode in the multi-port semiconductor memory in response to a control signal arbitrarily received via a first port in the plurality of I/O ports, wherein the first port is any one of the plurality of I/O ports.

4. The method of claim 3, wherein the multi-port semiconductor memory receives as control signals at least a chip selection signal (CSB), a row address strobe signal (RASB), a column address strobe signal (CASB), a write enable signal (WEB), a clock enable signal (CKE), and a clock signal (CLK), and activating the DPD mode in the multi-port semiconductor memory comprises receiving the CKE at a low level and then activating the DPD mode synchronously with CLK.

5. The method of claim 4, wherein deactivating the DPD mode in the multi-port semiconductor memory comprises transitioning the CKE and then deactivating the DPD mode synchronously with CLK.

6. A method of controlling a deep power down (DPD) mode in a multi-port semiconductor memory having a plurality of memory banks and a plurality of input/output (I/O) ports, the plurality of I/O ports being connected to a plurality of processors, the method comprising:

activating the DPD mode in the multi-port semiconductor memory and enabling a flag in accordance with a first signal applied via a set port in the plurality of I/O ports; and deactivating the DPD mode in the multi-port semiconductor memory and disabling the flag in accordance with a second signal applied via an arbitrary port in the plurality of I/O ports.

7. The method of claim 6, wherein the first and second signals are externally applied to the multi-port semiconductor memory.

* * * * *